United States Patent
Rajagopalan et al.

(10) Patent No.: US 10,808,503 B2
(45) Date of Patent: Oct. 20, 2020

(54) OVERVOLTAGE PROTECTION OF DOWNHOLE GENERATORS

(71) Applicant: Halliburton Energy Services, Inc., Houston, TX (US)

(72) Inventors: Satish Rajagopalan, Tomball, TX (US); Jaya Deepti Dasika, Humble, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 177 days.

(21) Appl. No.: 16/074,045

(22) PCT Filed: May 4, 2016

(86) PCT No.: PCT/US2016/030774
§ 371 (c)(1),
(2) Date: Jul. 30, 2018

(87) PCT Pub. No.: WO2017/192133
PCT Pub. Date: Nov. 9, 2017

(65) Prior Publication Data
US 2019/0048690 A1 Feb. 14, 2019

(51) Int. Cl.
*E21B 41/00* (2006.01)
*H02H 7/06* (2006.01)
(Continued)

(52) U.S. Cl.
CPC ........ *E21B 41/0085* (2013.01); *G01R 19/165* (2013.01); *H02H 3/20* (2013.01);
(Continued)

(58) Field of Classification Search
CPC ............ H02H 3/20; H02H 3/202; H02H 3/26; H02H 7/06; H02H 7/09; H02H 7/125;
(Continued)

(56) References Cited

U.S. PATENT DOCUMENTS 4,812,729 A * 3/1989 Ito .................... H02H 7/1216
318/732
10,612,347 B2 * 4/2020 Deolalikar .......... E21B 41/0085
(Continued)

FOREIGN PATENT DOCUMENTS

CN 102647138 A 8/2012
WO 01/52619 A2 7/2001
(Continued)

OTHER PUBLICATIONS

International Search Report and Written Opinion dated May 23, 2017; International PCT Application No. PCT/US2016/030774.

*Primary Examiner* — Matthew V Nguyen
(74) *Attorney, Agent, or Firm* — McGuireWoods LLP

(57) ABSTRACT

The disclosed embodiments include a method to protect a downhole generator from overvoltage. In one embodiment, the method includes determining a speed of an alternator. The method also includes activating overvoltage protection mode if the speed of the alternator is greater than a threshold speed, where activating the overvoltage protection mode includes converting an alternating current measured at the alternator into a first component and a second component of a direct current. Activating the overvoltage protection mode also includes determining a first current threshold based on at least one component of the downhole generator. Activating the overvoltage protection mode also includes shutting down the downhole generator if the first component of the direct current is greater than the first current threshold and decreasing a magnetic flux of the downhole generator if the first component of the direct current is not greater than the first current threshold.

20 Claims, 5 Drawing Sheets

(51) Int. Cl.
    *G01R 19/165*    (2006.01)
    *H02H 3/20*      (2006.01)
    *H02H 9/04*      (2006.01)
    *H02P 9/00*      (2006.01)
    *G01R 31/34*     (2020.01)

(52) U.S. Cl.
    CPC .............. *H02H 7/06* (2013.01); *H02H 9/041* (2013.01); *H02P 9/006* (2013.01); *G01R 31/343* (2013.01)

(58) Field of Classification Search
    CPC ........ H02H 7/1252; H02H 9/04; H02H 9/041; H02H 9/042; H02P 9/00; H02P 9/006; G01R 19/165; G01R 31/343; E21B 41/0085
    See application file for complete search history.

(56) References Cited

U.S. PATENT DOCUMENTS

| | | |
|---|---|---|
| 2008/0122643 A1 | 5/2008 | Kawagoe et al. |
| 2011/0170320 A1 | 7/2011 | Coenen et al. |
| 2013/0107408 A1 | 5/2013 | Le Brun et al. |
| 2014/0055065 A1 | 2/2014 | Suel, II et al. |
| 2015/0194871 A1 | 7/2015 | Hiles et al. |
| 2018/0351349 A1* | 12/2018 | Rajagopalan .......... H02H 7/125 |

FOREIGN PATENT DOCUMENTS

| | | |
|---|---|---|
| WO | 02/33816 A2 | 4/2002 |
| WO | 2010/019678 A1 | 2/2010 |
| WO | 2015/054432 A1 | 4/2015 |
| WO | 2015/134001 A1 | 9/2015 |

* cited by examiner

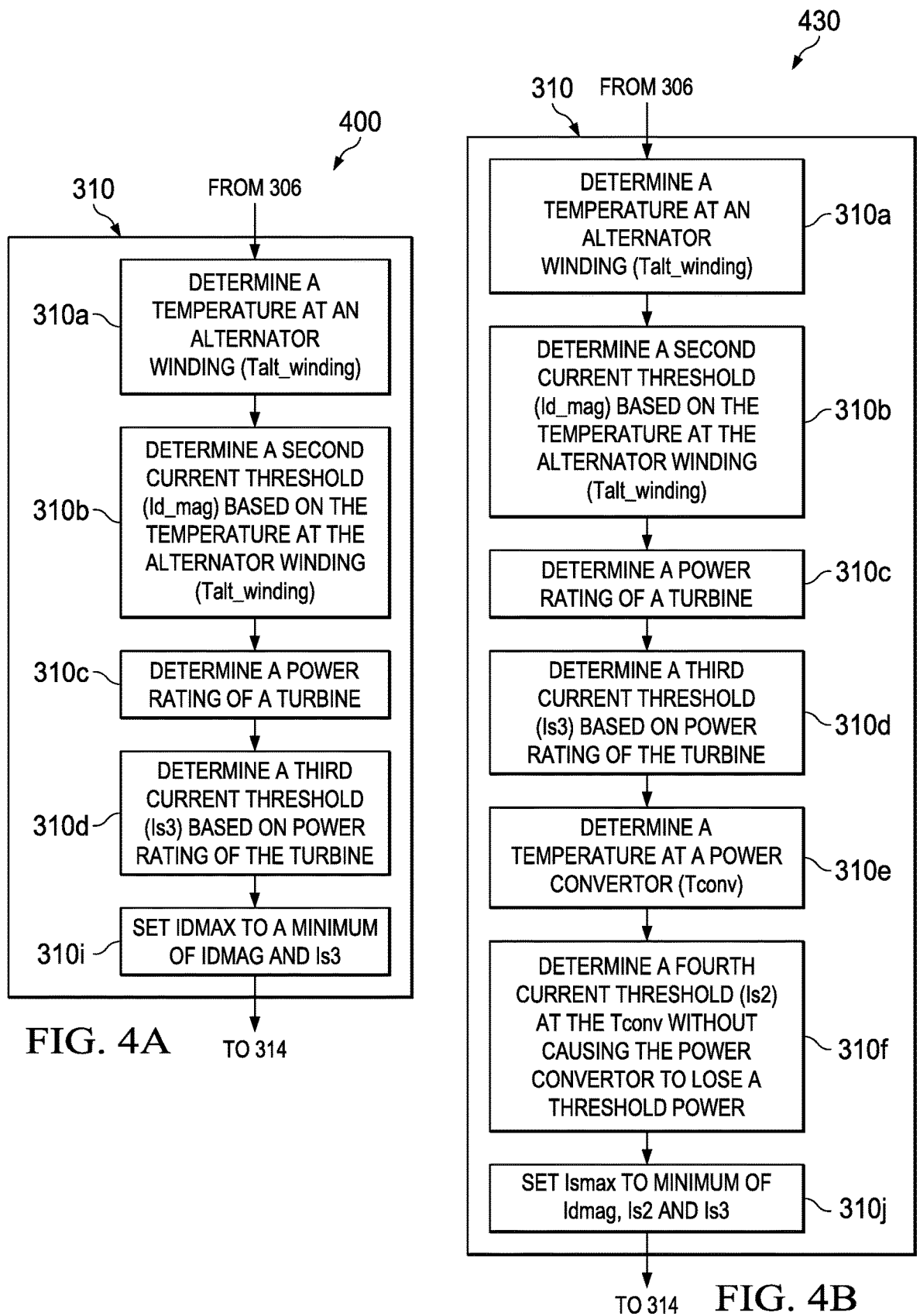

OVERVOLTAGE PROTECTION OF DOWNHOLE GENERATORS

BACKGROUND

The present disclosure relates generally to downhole generators, and methods and machine-readable mediums containing instructions to protect downhole generators from overvoltage.

Many downhole applications include a downhole generator deployed in a wellbore of a hydrocarbon well to generate electrical power and to supply the generated electrical power to one or more downhole tools and/or sensors. A downhole generator often includes a turbine that operates in an open loop and is driven by a fluid such as drilling mud that is circulated from the surface and through a drill string. As such, the speed of the turbine's motor is dependent on the fluid flow rate. The downhole generator also includes an alternator that is coupled to the turbine and is operable to convert kinetic energy generated by the turbine to electrical energy in the form of an alternating current. The downhole generator may further include a power convertor or similar component operable to convert the alternating current into direct current to power downhole electronics (load).

The rate of fluid flow may cause the turbine operate at a speed that is above a rated speed of the turbine. Voltage generated by downhole generators is often proportional to the speed of the turbine. As such, the power convertor and the load may experience overvoltage when the turbine operates above the rated speed. Electronic components of the downhole generator as well as components of the load that are not protected against overvoltage may be damaged and may need to be repaired. Given that the downhole generator and the load are deployed downhole, a drill string used to deploy the downhole generator and the load may need to be pulled out to service the damaged electronic components, thereby delaying hydrocarbon production.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, without departing from the scope of this disclosure.

FIG. 4A illustrates a process for determining a current threshold based on at least one component of the downhole generator;

FIG. 4B illustrates another process for determining a current threshold based on at least one component of the downhole generator.

Figure 1:
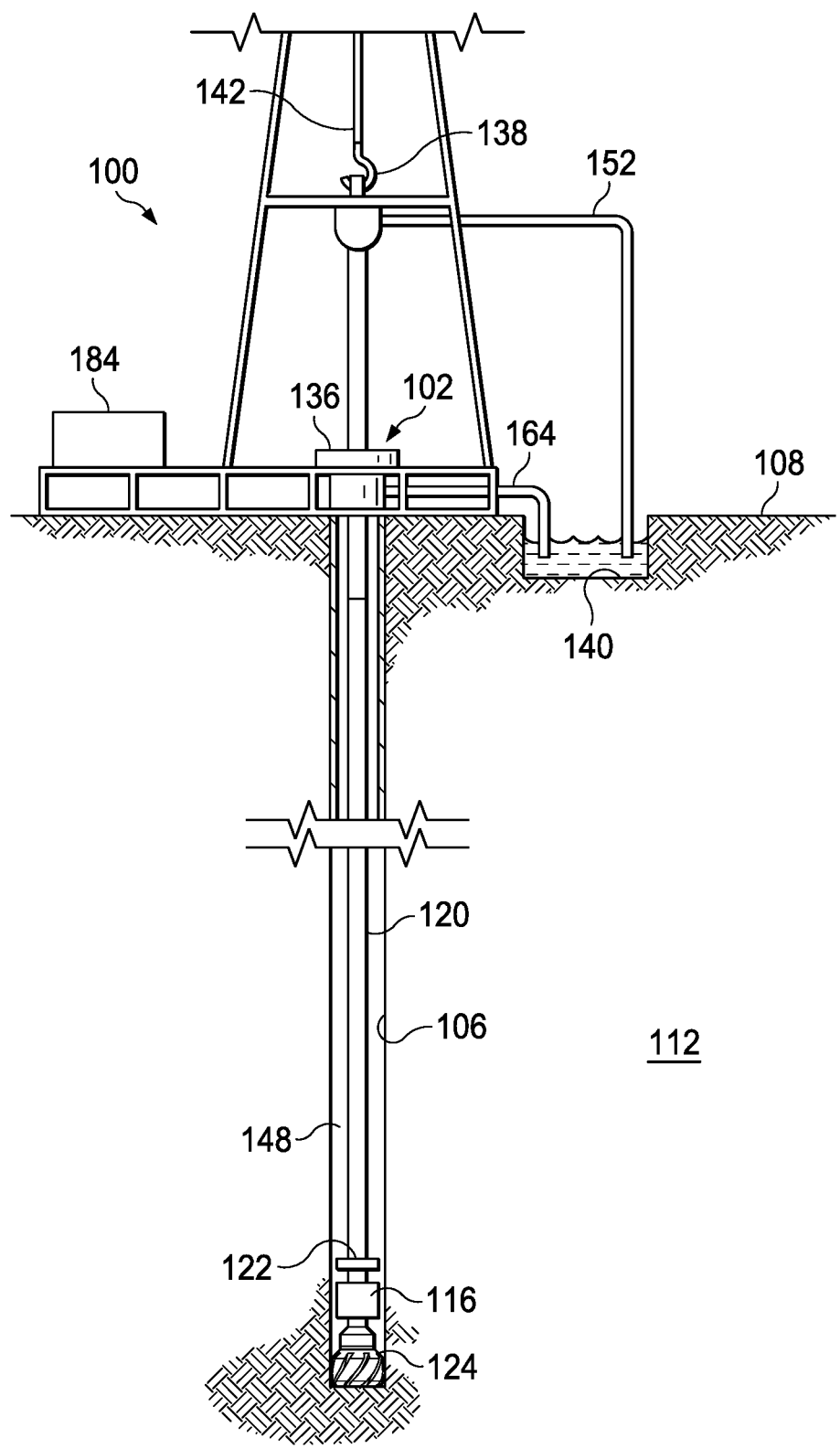
FIG. 1 illustrates a schematic view of a well environment in which a downhole generator is deployed to provide power to downhole electronic tools and sensors.

The illustrated figures are only exemplary and are not intended to assert or imply any limitation with regard to the environment, architecture, design, or process in which different embodiments may be implemented.

DETAILED DESCRIPTION OF ILLUSTRATIVE EMBODIMENTS

In the following detailed description of the illustrative embodiments, reference is made to the accompanying drawings that form a part hereof. These embodiments are described in sufficient detail to enable those skilled in the art to practice the invention, and it is understood that other embodiments may be utilized and that logical structural, mechanical, electrical, and chemical changes may be made without departing from the spirit or scope of the invention. To avoid detail not necessary to enable those skilled in the art to practice the embodiments described herein, the description may omit certain information known to those skilled in the art. The following detailed description is, therefore, not to be taken in a limiting sense, and the scope of the illustrative embodiments is defined only by the appended claims.

The present disclosure relates to downhole generators and methods to protect the downhole generators and electronics from overvoltage. In some embodiments, a downhole generator includes a turbine, an alternator, a power convertor, and a controller. The turbine is operable to generate mechanical energy from a fluid flowing through and around the turbine. The alternator is coupled to the turbine and is operable to convert mechanical energy generated by the turbine into electrical energy, in the form of alternating current. A power convertor is coupled to the alternator and is operable to convert alternating current generated by the alternator into direct current, which is supplied to one or more downhole loads, such as drills, measuring devices, power supplies, etc. The operations of the downhole generator are controlled by the controller.

The turbine has a rated speed, which is approximately an operating speed of the turbine at which a rated voltage and a rated torque are produced. The electrical components of the downhole generator as well as other electrical components coupled to the downhole generator are rated to safely handle the rated voltage. As the speed of the turbine increases above the rated speed, the back-electromotive force (emf) increases proportionally as well. The terminal voltage of the alternator thereby increases and can exceed the safety threshold of the alternator and any electronics downstream. In conventional synchronous machines, air gap flux linkages may be weakened by decreasing the magnetizing flux generated by magnetic members of the rotor using separate field windings. In permanent magnet synchronous machines, the air gap flux linkages may be weakened by using a portion of the stator current to cancel the air-gap flux. More particularly, in permanent magnet generators, the air gap flux linkages may be weakened by using a d-axis component of a dq-current (Id), where a non-zero Id produces an opposing flux that reduces the air gap flux. As such, the voltage is limited to rated voltage, even when the speed of the turbine exceeds the rated speed. Further, the torque producing constant component of the dq-current Iq may also be simultaneously adjusted to provide the rated power, thereby extending the usable working region of the alternator. As such, the downhole generator may produce rated power even when the speed of the turbine exceeds the rated speed.

Now turning to the figures, FIG. 1 illustrates a schematic view of a well environment 100 in which a downhole generator 116 is deployed to provide power to downhole electronic tools and sensors. FIG. 1 may represent any production or preparation environment, such as logging while drilling and measurement while drilling environment, where downhole generator 116 may be deployed. In the embodiment of FIG. 1, a well 102 having a wellbore 106 extends from a surface 108 of the well 102 to or through a subterranean formation 112. A hook 138, cable 142, traveling block (not shown), and hoist (not shown) are provided to lower a tool string 120 down the wellbore 106 or to lift the tool string 120 up from the wellbore 106. The tool string 120 may be a wirelines tool string, a slickline tool string, a drill string, or another type of tool string operable to deploy the downhole generator 116. While not depicted, the embodiments disclosed herein may be applicable in other downhole environments and systems, such as permanent monitoring, production or casing strings, or other systems that employ fluid driven downhole turbine.

At wellhead 136, an inlet conduit 152 is coupled to a fluid source (not shown) to provide fluids, such as drilling mud, downhole. The tool string 120 has an internal cavity that provides a fluid flow path from the surface 108 down to the downhole generator 116. The tool string 120 is coupled to the downhole generator 116 and is fitted with electrical components (load) 122 which may include, without limitation, sensors and instruments operable to make one or more types of downhole measurements, as well as batteries or other types of power supplies operable to store electrical energy for subsequent transmission to instruments, sensors, tools, and other electrically-powered equipment. The fluids travel down the tool string 120, through the downhole generator 116, and exit the tool string 120 at drill bit 124. The fluids flow back towards the surface 108 through a wellbore annulus 148 and exit the wellbore annulus 148 via an outlet conduit 164 where the fluids are captured in a container 140. The downhole generator 116 is operable to convert kinetic energy resulting from hydraulic forces applied by the aforementioned fluids, into electrical current. The downhole generator 116 provides the generated electrical current to the load 122 to power the load 122. Additional descriptions of the downhole generator 116 are described in the following paragraphs and are illustrated in at least FIGS. 2, 3, and 4A-4C. Measurements made by the load 122 are monitored by controller 184 at the surface 108.

Figure 2:
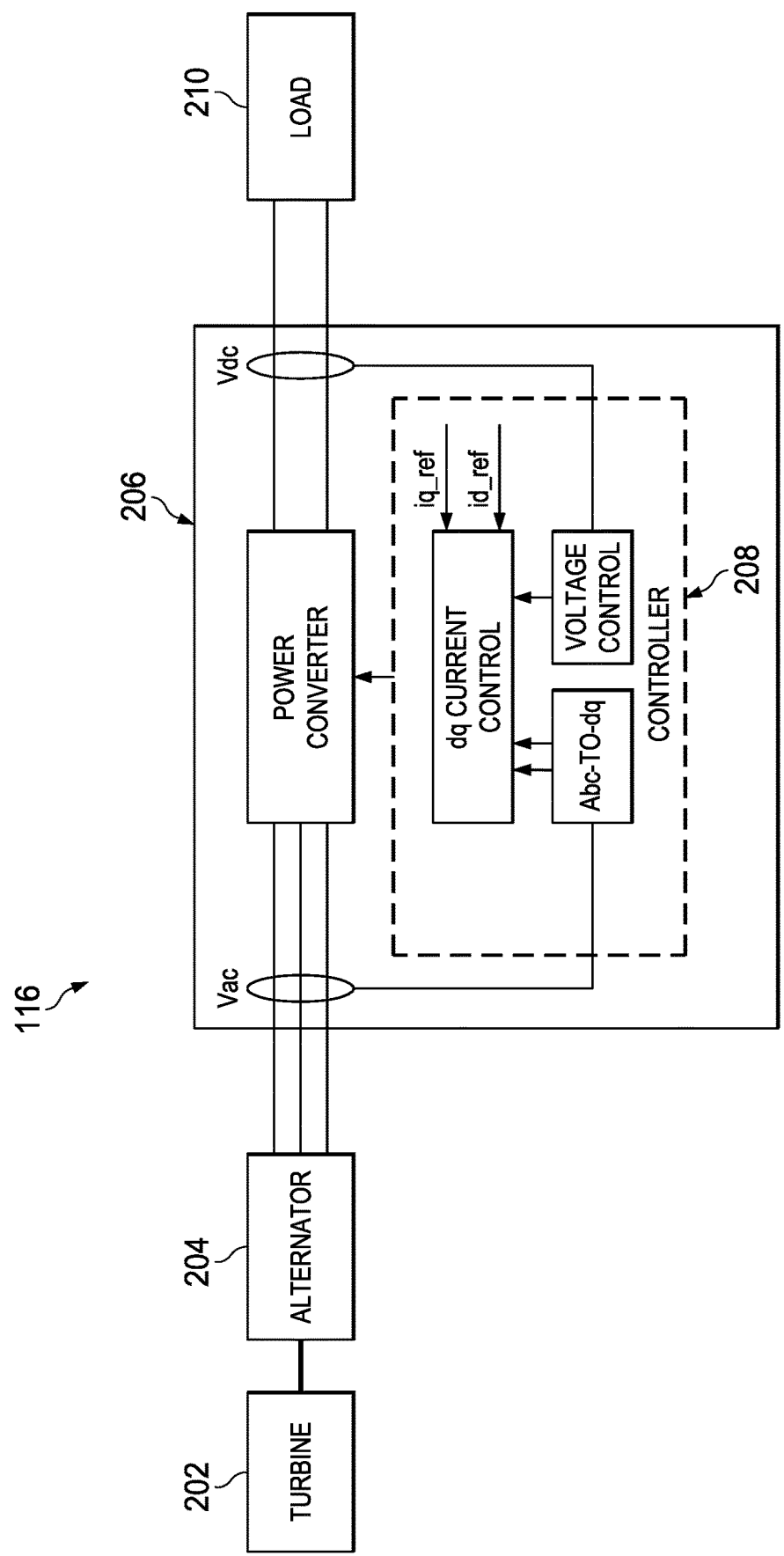
FIG. 2 illustrates a schematic, system diagram of the downhole generator of FIG. 1.

FIG. 2 illustrates a schematic, system diagram of the downhole generator 116 of FIG. 1. The downhole generator 116 includes a turbine 202 having a set of turbine blades (not shown). The turbine blades are driven by fluids that circulate into the wellbore 102. The turbine 202 has a rated speed, which is approximately an operating speed of the turbine 202, at which a rated voltage and a rated torque are produced. One or more sensors (not shown) are coupled to the turbine 202 to measure one or more operational characteristics of the turbine 202, such as the speed of the turbine 202, the fluid flow rate through the turbine 202, and the temperature of the turbine 202.

An alternator 204, which includes at least one rotor (not shown) and at least one stator (not shown) is coupled to the turbine. In some embodiments, the rotor includes a set of magnetic members aligned radially along a surface of the rotor, where each magnetic member has a polarity opposite to the polarity of adjacent magnetic members. The rotor is surrounded by the stator, which includes a set of windings. In one of such embodiments, the rotor is mechanically coupled to the turbine and rotates at a rate proportional to the speed of the turbine. The rotating magnetic members generate a revolving magnetic flux, which in turn generates an alternating current through the alternator windings. In other embodiments, the rotor includes a set of windings and the stator includes a set of magnetic members aligned radially around the stator, where each magnetic member has a polarity opposite to the polarity of adjacent magnetic members. An alternating current is generated as the alternator windings rotate in between the magnetic members. One or more sensors (not shown) are coupled to the alternator 204 to measure one or more operational characteristics of the alternator 204, such as the speed of rotor of the alternator 204, the temperature of the alternator windings, the amount alternating current flowing through the alternator windings, and the magnitude of the air gap flux linkages.

A power converter 206 having a controller 208 is coupled to the alternator 204 and a load 210. The power convertor 206 includes a rectifier (not shown) that is operable to convert alternating current flowing from the alternator into direct current. The direct current is provided to the load 210.

The controller 208 includes one or more machine or computer readable mediums (storage medium) to store instructions for operating the downhole generator 116. Examples of storage mediums include, but are not limited to, read-only memory (ROM), random access memory (RAM), flash memory, magnetic hard drives, solid state hard drives, as well as other types of similar storage mediums. The controller 208 also includes one or more processors operable to execute instructions stored in the storage medium to operate the downhole generator 116.

In some embodiments, the controller 208 is operable to obtain operational characteristics of the turbine 202, the alternator 204, and the load 210. In one of such embodiments, the controller 208 obtains a measured alternating current at the alternator windings and performs a d-q transformation of the measured alternating current into a first component of a direct current (Id) and a second component of the direct current (Iq). In one of such embodiments, the controller 208 is operable to regulate Id, Iq, and the voltage of the direct current (Vdc). The controller 208 also obtains the turbine speed and the alternator speed to determine whether the alternator is operating a rated (threshold) speed. If the speed of the alternator is greater than the threshold speed, then the controller 208 activates overvoltage protection mode. If overvoltage protection mode is activated, the controller 208 performs voltage control and current control based on various operational characteristics of the turbine 202, the alternator 204, and the load 210 to determine whether to modify the Id and Iq components to increase the back-emf or to shut down the downhole generator/power converter. Additional descriptions of the operations of the controller 208 are described in the following paragraphs and are illustrated in at least FIGS. 3 and 4A-4C.

Figure 3:
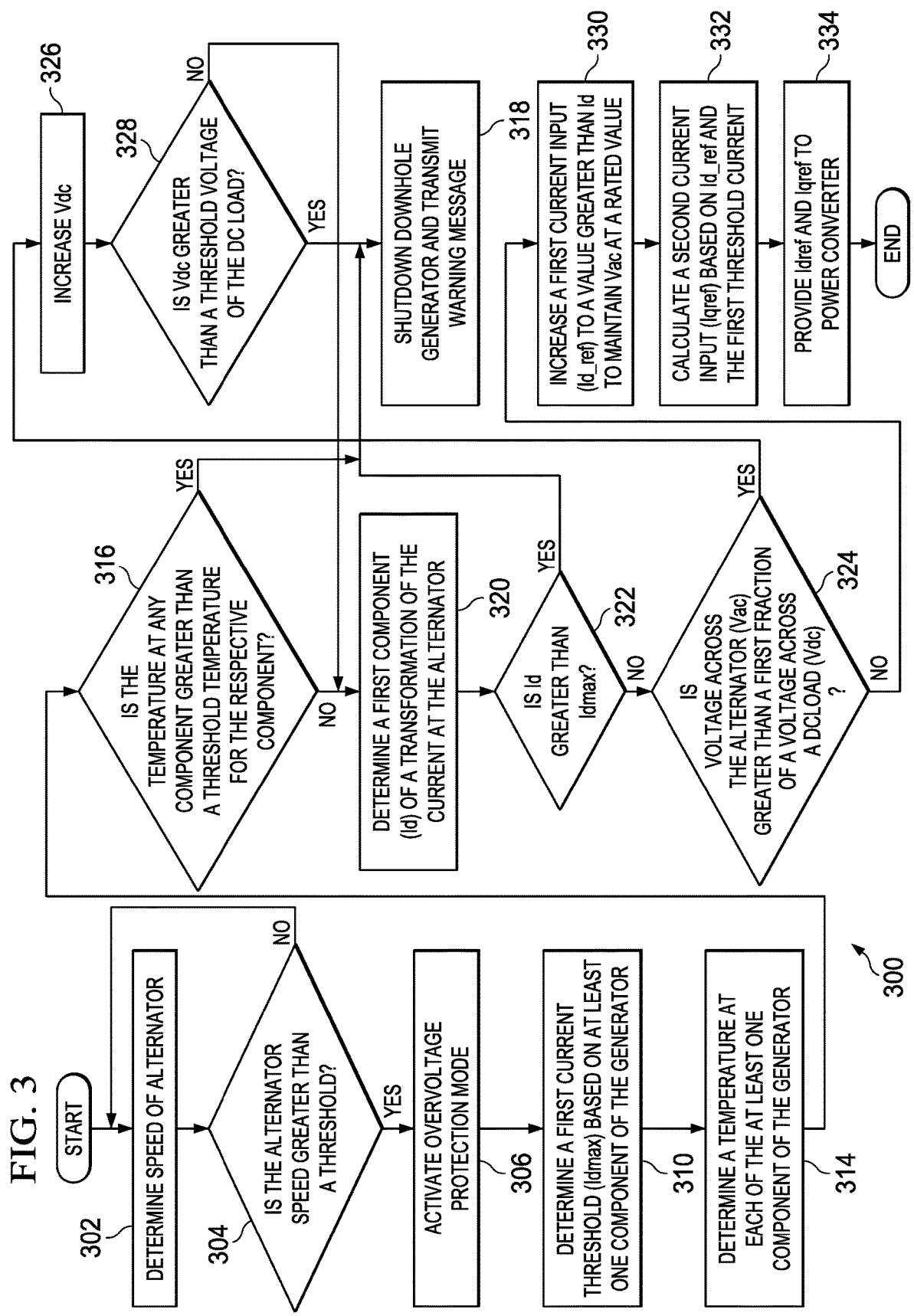
FIG. 3 is a flowchart illustrating a process to protect the downhole generator from overvoltage.

FIG. 3 is a flowchart illustrating a process 300 to protect the downhole generator 116 of FIG. 1 from overvoltage. Although the paragraphs below describe the operations of the process 300 being performed by the controller 208, one of ordinary skill would understand that the controller 208 may utilize one or more processor components to execute instructions stored on a storage medium of the controller 208. Additionally, the process may also be performed by another component of the downhole generator 116, or by a controller or similar electronic component that is communicatively connected to the downhole generator 116. Further, although operations in the process 300 are shown in a particular sequence, certain operations may be performed in different sequences or at the same time where feasible.

The process 300 begins when fluids such as drilling mud flow through the downhole generator 116. At step 302, the controller 208 determines the speed of the alternator 204. In some embodiments, one or more sensors coupled to the alternator 204 measures the speed of a rotor component of the alternator 204 and provides the measured speed to the controller 208. In other embodiments, the speed of the rotor component of the alternator 204 is proportional to the speed of the turbine 202. In one of such embodiments, a sensor coupled to the turbine 202 measures the speed of the turbine 202 and provides the measured speed to the controller 208. The controller 208 then accesses a look-up table or performs calculations to determine the speed of the alternator 204 based on the measured speed of the turbine 202.

At step 304, if the controller 208 determines that the speed of the alternator 204 (e.g., the rotor component of the alternator 204) is not greater than a rated (threshold) speed, then the process returns to step 302. If the controller 208 determines that the speed of the alternator 204 is greater than the threshold speed, then the process proceeds to step 306 and overvoltage protection is activated. The process then proceeds to step 310 and the controller 208 determines a first current threshold (Id_max) based on operational characteristics of at least one component of the downhole generator 116. Additional descriptions of operational characteristics of different components of the downhole generator 116, such as the turbine 202, the alternator 204, and the power convertor 206, and descriptions on how to calculate first current threshold are described in the following paragraphs and are illustrated in at least FIGS. 4A-4C. The process then proceeds to step 314.

At step 314, the controller 208 determines a temperature at the at least one component of the downhole generator 116. At step 316, if the temperature of any component of the at least one component of the downhole generator 116 is greater than a rated (threshold) temperature for the respective component, then the process proceeds to step 318 and the controller 208 shuts down the downhole generator 116. In some embodiments, the controller 208 shuts down the rectifier component of the power convertor 206. The controller 208 also generates signals indicative of a warning message that the downhole generator 116 has been shut down. The warning message may be transmitted via a telemetry system to the controller 184 at the surface 108. In some embodiments, the controller 208 is further operable to determine the speed of the alternator 204 at a time interval after the downhole generator 116 has been shut down. In one of such embodiments, the controller 208 is further operable to restart the downhole generator 116 if the speed of the alternator 204 is less than or equal to the threshold speed for restarting the alternator 204.

At step 316, if the temperature of each component of the at least one component of the downhole generator 116 is not greater than the threshold temperature for the respective component, then the process proceeds to step 320, and the controller 208 determines a first component (Id) of a transformation of the current measured at the alternator windings. In some embodiments, the controller 208 may perform a d-q transformation of the current measured at the alternator windings to determine Id. In other embodiments, the controller 208 may access a look-up table to determine Id based on the current at the alternator windings. The process then proceeds to step 322. At step 322, the controller 208 determines whether Id is greater than Id_max. If Id is greater than Id_max, then the process proceeds to step 318. Alternatively, if Id is not greater than Id_max, then the process proceeds to step 324.

At step 324, the controller 208 determines whether the voltage across the alternator 204 (Vac) is greater than a fraction of a voltage across the load 210 (Vdc). In some embodiments, the value of the fraction is determined based on the material properties of the load 210. If Vac is greater than the fraction of Vdc then the process proceeds to step 326, Vdc is increased, and the process proceeds to step 328. At step 328, the controller 208 determines if Vdc is greater than a threshold voltage of the load 210. If Vdc is greater than the threshold voltage, then the process proceeds to step 318. Alternatively, if Vdc is not greater than the threshold voltage, then the process proceeds to step 320.

If the voltage across the alternator 204 is not greater than the fraction of the voltage at the load 210, then the process proceeds to step 330, and the controller 208 increases a first current input (Id_ref) to a value greater than Id to maintain the voltage across the alternator 204 at the rated value. At step 332, the controller 208 calculates a second current input (Iq_ref) based on Id_ref and on Id_max. In some embodiments, Iq_ref is determined by the formula: $\sqrt{Is\_max^2 + Id\_ref^2}$. In such embodiments, Is_max is an approximate maximum value of the alternating current and wherein Id_ref is the first input. In other embodiments, the controller 208 accesses a look-up table to determine Iq_ref based on the Id_ref. At step 334, the controller 208 provides the Id_ref and the Iq_ref to the power convertor 206 to generate a back-emf to weaken the magnetic flux across the alternator 204.

Figure 4C:
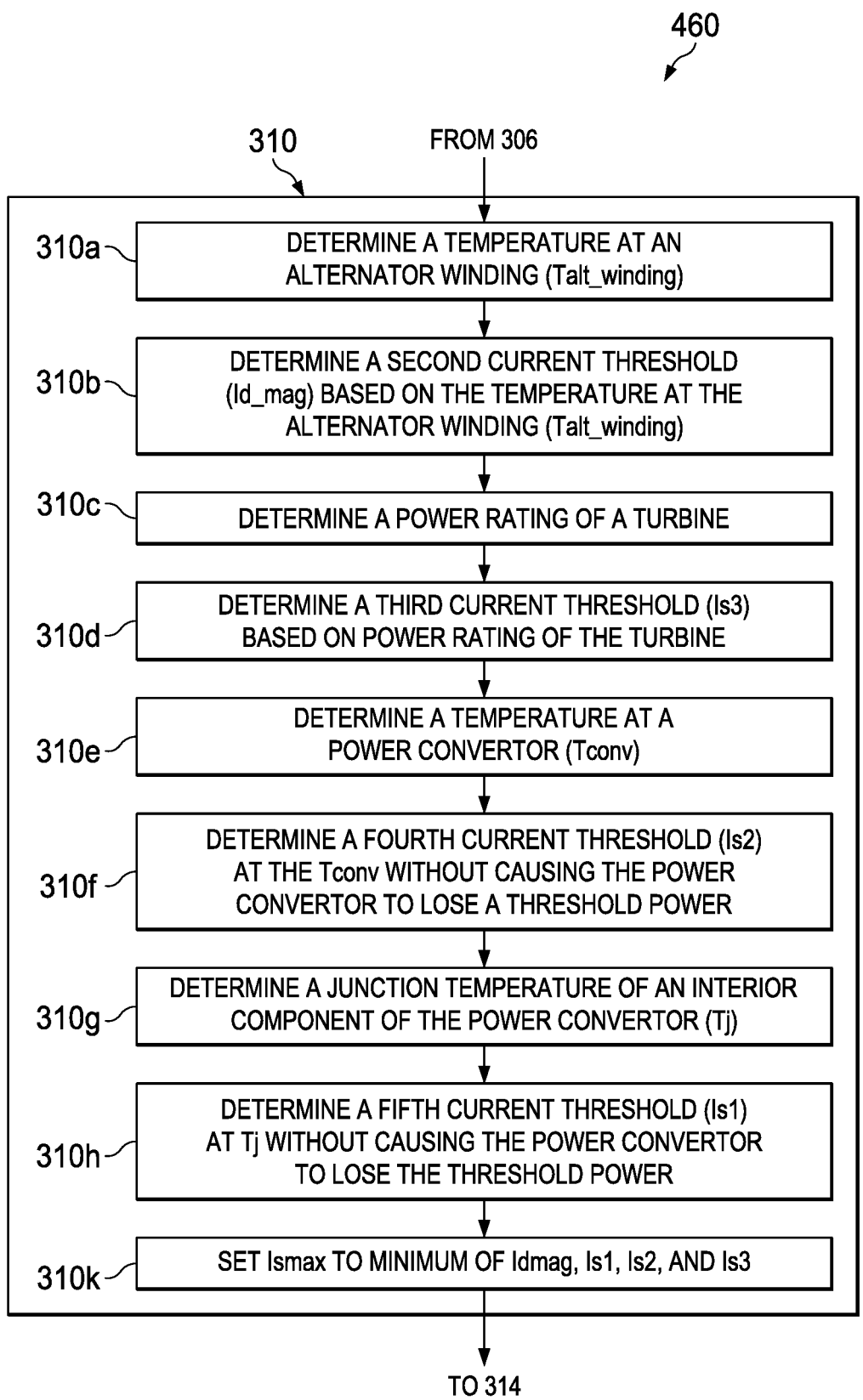
FIG. 4C illustrates a further process for determining a current threshold based on at least one component of the downhole generator.

FIGS. 4A-4C illustrates three processes for determining the first current threshold (Id_max) based on at least one component of the downhole generator. Although the paragraphs below describe the operations of the processes 400, 430, and 460 being performed by the controller 208, one of ordinary skill would understand that the controller 208 may utilize one or more processor components to execute instructions stored on a storage medium of the controller 208. Additionally, the process may also be performed by another component of the downhole generator 116, or by a controller or similar electronic component that is communicatively connected to the downhole generator 116. Further, although operations in the processes 400, 430, and 460 are shown in a particular sequence, certain operations may be performed in different sequences or at the same time where feasible.

In step 310a of process 400, the controller 208 determines the temperature at the alternator windings (Talt_winding). Talt_winding may be obtained by a sensor at the alternator windings. At step 310b, the controller 208 determines a second current threshold (Id_mag) based on the temperature at the alternator windings. In some embodiments, the controller 208 accesses a look-up table stored in the storage medium of the controller 208 to determine Id_mag corresponding to the temperature of the alternator windings. At step 310c, the controller 208 determines the power rating of the turbine 202. At step 310d, the controller 208 determines a third current threshold (Is3) based on the power rating of the turbine 202. In some embodiments, the controller 208 may access a look-up table to determine Is3 based on the power rating of the turbine 202. In further embodiments, the processor of the controller 208 may calculate Is3 based on the power rating of the turbine 202. The process then proceeds to step 310i. At step 310i, the controller 208 sets Id_max to equal to the minimum of Id_mag and Is3. The process 400 then proceeds to step 314 of process 300.

The process 430 illustrated in FIG. 4B includes each of steps 310a-d of FIG. 4A. At step 310e, the controller 208 determines the temperature of the power convertor 206 (Tconv). At step 310f, the controller 208 determines a fourth current threshold (Is2) at Tconv without causing the power convertor 206 to lose a threshold amount of power. The controller 208 may access a look-up table or may perform calculations to determine Is2. The process then proceeds to step 310*j*. At step 310*j*, the controller 208 sets Id_max to equal to the minimum of Id_mag, Is3, and Is2. The process 430 then proceeds to step 314 of process 300.

The process 460 illustrated in FIG. 4C includes each of steps 310*a*-30*f*. At step 310*g*, the controller 208 determines the interior junction temperature (Tj) of the power convertor 206. At step 310*h*, the controller 208 determines a fifth current threshold (Is1) at Tj without causing the power convertor 206 to lose a threshold amount of power. The controller 208 may access a look-up table or may perform calculations to determine Is1. The process then proceeds to step 310*k*. At step 310*k*, the controller 208 sets Id_max to equal to the minimum of Id_mag, Is3, Is2, and Is1. The process 460 then proceeds to step 314 of process 300. The controller 208 may determine additional current thresholds based on other components of the downhole generator 116 or the load 210. In such embodiments, Id_max is set to the minimum of all of current thresholds.

The above-disclosed embodiments have been presented for purposes of illustration and to enable one of ordinary skill in the art to practice the disclosure, but the disclosure is not intended to be exhaustive or limited to the forms disclosed. Many insubstantial modifications and variations will be apparent to those of ordinary skill in the art without departing from the scope and spirit of the disclosure. For instance, although the flowcharts depict a serial process, some of the steps/processes may be performed in parallel or out of sequence, or combined into a single step/process. The scope of the claims is intended to broadly cover the disclosed embodiments and any such modification. Further, the following clauses represent additional embodiments of the disclosure and should be considered within the scope of the disclosure:

Clause 1, a method to protect a downhole generator from overvoltage, comprising: determining a speed of an alternator; and activating an overvoltage protection mode if the speed of the alternator is greater than a threshold speed, wherein activating the overvoltage protection mode comprises: converting an alternating current measured at the alternator into a first component of a direct current (Id) and a second component of the direct current (Iq); determining a first current threshold (Id_max) based on at least one component of the downhole generator; shutting down the downhole generator if the first component of the direct current is greater than the first current threshold; and decreasing a magnetic flux of the downhole generator if the first component of the direct current is not greater than the first current threshold.

Clause 2, the method of clause 1, wherein determining the first current threshold further comprises: determining a temperature at a winding of the alternator; determining a second current threshold (Id_mag) based on the temperature at the alternator windings; determining a power rating of a turbine of the downhole generator; determining a third current threshold (Is3) based on the power rating of the turbine; and setting a value of the first current threshold to equal to a minimum of the second current threshold and the third current threshold.

Clause 3, the method clause 1 or clause 2, wherein determining the first current threshold further comprises: determining a temperature at a power convertor component of the downhole generator; and determining a fourth current threshold (Is2) at the power convertor based on the temperature at the power convertor, the fourth current threshold being approximately equal to a maximum current without causing the power convertor to lose a threshold level of power, and wherein setting the value of the first current threshold comprises setting the value of the first current threshold to equal to a minimum of the second current threshold, the third current threshold, and the fourth current threshold.

Clause 4, the method of any combination of clauses 1-3, wherein determining the first current threshold further comprises: determining a temperature at an interior component of the power convertor; and determining a fifth current threshold (Is1) at the power module based on the temperature at the interior component of the power convertor, the fifth current threshold being approximately equal to a maximum current without causing the power convertor to lose the threshold level of power, and wherein setting the value of the first current threshold comprises setting the value of the first current threshold to equal to a minimum of the second current threshold, the third current threshold, the fourth current threshold, and the fifth current threshold.

Clause 5, the method of any combination of clauses 1-4, wherein at least one of the third current threshold, the fourth current threshold, and the fifth current threshold is determined from a look-up table.

Clause 6, the method of any combination of clauses 1-5, further comprising determining a voltage of the alternator (Vac), wherein if the voltage of the alternator is not greater than a threshold fraction of a voltage across a direct current load, decreasing the magnetic flux further comprises: increasing a first input (Id_ref) to a value greater than the first component of a direct current to maintain the voltage of the alternator at a rated value; calculating a second input (Iq_ref) based on the first input and the first current threshold; and providing the first input and the second input to a controller to modify a back electromotive force.

Clause 7, the method of any combination of clauses 1-6, wherein the second input is equal to $\sqrt{\text{Is\_max}^2 + \text{Id\_ref}^2}$, wherein Is_max is an approximate maximum value of the alternating current, and wherein Id_ref is the first input.

Clause 8, the method of any combination of clauses 1-7, wherein if the voltage of the alternator is greater than the threshold fraction of the voltage across the direct current load, the method further comprises: increasing a voltage of the direct current load; and shutting down the downhole generator if the voltage of the direct current load is greater than the threshold voltage of the direct current load.

Clause 9, the method of any combination of clauses 1-8, further comprising transmitting a warning signal that the downhole generator is shut down if the first component of the direct current is greater than the first current threshold or if a temperature of the at least one component of the downhole generator is greater than a threshold temperature of the at least one component of the downhole generator.

Clause 10, the method of any combination of clauses 1-9, further comprising: determining a temperature at each component of the at least one component of the downhole generator; and shutting down the downhole generator if the temperature of any component of the at least one component of the downhole generator is greater than a threshold temperature of the respective component of the at least one component of the downhole generator.

Clause 11, the method of any combination of clauses 1-10, further comprising: determining, at a time interval after the downhole generator has been shut down, the speed of the alternator; and restarting the downhole generator if the speed of the alternator is less than or equal to the threshold speed.

Clause 12, a downhole generator, comprising: a turbine operable to generate mechanical energy from a fluid flow; an alternator operable to convert the mechanical energy into an alternating current; a power converter operable to convert the alternating current to a direct current to supply power to a direct current load; a controller operable to: determine a speed of the alternator; convert the alternating current into a first component of the direct current (id) and a second component of the direct current (Iq); and activate an overvoltage protection mode if the speed of the alternator is greater than a threshold speed, wherein when the overvoltage protection mode is activated, the controller is further operable to: determine a first current threshold (Id_max) based on at least one component of the downhole generator; determine a temperature at each component of the at least one component of the downhole generator; shut down the downhole generator if the first component of the direct current is greater than the first current threshold or if the temperature at any component of the at least one component of the downhole generator is greater than a threshold temperature of the respective component of the at least one component of the downhole generator; and decrease a magnetic flux of the downhole generator if the first component of the direct current is not greater than the first current threshold and if the temperature at each component of the at least one component of the downhole generator is not greater than the threshold temperature of the respective component of the at least one component of the downhole generator.

Clause 13, the downhole generator of clause 12, wherein if a voltage of the alternator is not greater than a threshold fraction of a voltage across a direct current load, the controller is further operable to: increase a first input (Id_ref) to a value greater than the first component of a direct current to maintain a voltage across the alternator at a rated value; calculate a second input (Iq_ref) based on the first input and the first current threshold; and provide the first input and the second input to the controller to modify a back electromotive force.

Clause 14, the downhole generator of any one of clause 12 or 13, wherein if the voltage of the alternator is greater than the threshold fraction of the voltage across the direct current load, the controller is further operable to: increase the voltage of the direct current load; and shutdown the downhole generator if the voltage of the direct current load is greater than the threshold voltage of the direct current load.

Clause 15, the downhole generator of any combination of clauses 12-14, wherein the controller is further operable to transmit a warning signal that the downhole generator is shut down if the first component of the direct current is greater than the first current threshold or if the temperature at any component of the at least one component of the downhole generator is greater than the threshold temperature of the respective component of the at least one component of the downhole generator.

Clause 16, a machine-readable medium comprising instructions stored therein, which when executed by one or more processors, cause the one or more processors to perform operations comprising: determining a speed of an alternator; and activating an overvoltage protection mode if the speed of the alternator is greater than a threshold speed, wherein activating the overvoltage protection mode comprises: converting an alternating current measured at the alternator into a first component of a direct current (id) and a second component of the direct current (Iq); determining a first current threshold (Id_max) based on at least one component of the downhole generator; determining a temperature at the at least one component of the downhole generator; shutting down the downhole generator if the first component of the direct current is greater than the first current threshold or if the temperature at any component of the at least one component of the downhole generator is greater than a threshold temperature of the respective component of the at least one component of the downhole generator; and decreasing a magnetic flux of the downhole generator if the first component of the direct current is not greater than the first current threshold and if the temperature at each component of the at least one component of the downhole generator is not greater than the respective threshold temperature of the component of the at least one component of the downhole generator.

Clause 17, the machine-readable medium of clause 16, wherein the instructions when executed by the one or more processors, cause the one or more processors to perform operations comprising: increasing a first input (Id_ref) to a value greater than the first component of a direct current to maintain a voltage of the alternator at a rated value; calculating a second input (Iq_ref) based on the first input and the first current threshold; and providing the first input and the second input to a controller to modify a back electromotive force.

Clause 18, the machine-readable medium of any one of clauses 16 or 17, wherein the instructions when executed by the one or more processors, cause the one or more processors to perform operations comprising: determining a temperature at a winding of the alternator; determining a second current threshold (Id_mag) based on the temperature at the alternator windings; determining a power rating of a turbine of the downhole generator; determining a third current threshold (Is3) based on the power rating of the turbine; and setting a value of the first current threshold to equal to a minimum of the second current threshold and the third current threshold.

Clause 19, the machine-readable medium of any combination of clauses 16-18, wherein the instructions when executed by the one or more processors, cause the one or more processors to perform operations comprising: determining a temperature at a power convertor component of the downhole generator; and determining a fourth current threshold (Is2) at the power convertor based on the temperature at the power convertor component of the downhole generator, wherein setting the value of the first current threshold comprises setting the value of the first current threshold to equal to a minimum of the second current threshold, the third current threshold, and the fourth current threshold.

Clause 20, the machine-readable medium of any combination of clauses 16-19, wherein the instructions when executed by the one or more processors, cause the one or more processors to perform operations comprising: determining an interior temperature of the power convertor component of the downhole generator; and determining a fifth current threshold (Is1) at the power convertor based on the interior temperature of the power convertor component, wherein setting the value of the first current threshold comprises setting the value of the first current threshold to equal to a minimum of the second current threshold, the third current threshold, the fourth current threshold, and the fifth current threshold.

As used herein, approximately equal to x or having an approximate value of x is defined to include the exact value of x. Further, approximately identical to is defined to include identical to.

Unless otherwise specified, any use of any form of the terms "connect," "engage," "couple," "attach," or any other term describing an interaction between elements in the foregoing disclosure is not meant to limit the interaction to direct interaction between the elements and may also include indirect interaction between the elements described. As used herein, the singular forms "a", "an" and "the" are intended to include the plural forms as well, unless the context clearly indicates otherwise. Unless otherwise indicated, as used throughout this document, "or" does not require mutual exclusivity. It will be further understood that the terms "comprise" and/or "comprising," when used in this specification and/or the claims, specify the presence of stated features, steps, operations, elements, and/or components, but do not preclude the presence or addition of one or more other features, steps, operations, elements, components, and/or groups thereof. In addition, the steps and components described in the above embodiments and figures are merely illustrative and do not imply that any particular step or component is a requirement of a claimed embodiment.

It should be apparent from the foregoing that embodiments of an invention having significant advantages have been provided. While the embodiments are shown in only a few forms, the embodiments are not limited but are susceptible to various changes and modifications without departing from the spirit thereof.

We claim:

1. A method to protect a downhole generator from overvoltage, comprising:
   determining a speed of an alternator; and
   activating an overvoltage protection mode if the speed of the alternator is greater than a threshold speed,
   wherein activating the overvoltage protection mode comprises:
      converting an alternating current measured at the alternator into a first component of a direct current and a second component of the direct current;
      determining a first current threshold based on at least one component of the downhole generator;
      shutting down the downhole generator if the first component of the direct current is greater than the first current threshold; and
      decreasing a magnetic flux of the downhole generator if the first component of the direct current is not greater than the first current threshold.

2. The method of claim 1, wherein determining the first current threshold further comprises:
   determining a temperature at a winding of the alternator;
   determining a second current threshold based on the temperature at the winding of the alternator;
   determining a power rating of a turbine of the downhole generator;
   determining a third current threshold based on the power rating of the turbine; and
   setting a value of the first current threshold to equal to a minimum of the second current threshold and the third current threshold.

3. The method of claim 2, wherein determining the first current threshold further comprises:
   determining a temperature at a power convertor component of the downhole generator; and
   determining a fourth current threshold at the power convertor based on the temperature at the power convertor, the fourth current threshold being approximately equal to a maximum current without causing the power convertor to lose a threshold level of power, and
   wherein setting the value of the first current threshold comprises setting the value of the first current threshold to equal to a minimum of the second current threshold, the third current threshold, and the fourth current threshold.

4. The method of claim 3, wherein determining the first current threshold further comprises:
   determining a temperature at an interior component of the power convertor; and
   determining a fifth current threshold at the power convertor based on the temperature at the interior component of the power convertor, the fifth current threshold being approximately equal to a maximum current without causing the power convertor to lose the threshold level of power, and
   wherein setting the value of the first current threshold comprises setting the value of the first current threshold to equal to a minimum of the second current threshold, the third current threshold, the fourth current threshold, and the fifth current threshold.

5. The method of claim 4, wherein at least one of the third current threshold, the fourth current threshold, and the fifth current threshold is determined from a look-up table.

6. The method of claim 1, further comprising determining a voltage of the alternator,
   wherein if the voltage of the alternator is not greater than a threshold fraction of a voltage across a direct current load, decreasing the magnetic flux further comprises:
      increasing a first input to a value greater than the first component of a direct current to maintain the voltage of the alternator at a rated value;
      calculating a second input based on the first input and the first current threshold; and
      providing the first input and the second input to a controller to modify a back electromotive force.

7. The method of claim 6, wherein the second input is equal to $\sqrt{Is\_max^2 + Id\_ref^2}$, wherein Is_max is an approximate maximum value of the alternating current, and wherein Id_ref is the first input.

8. The method of claim 6, wherein if the voltage of the alternator is greater than the threshold fraction of the voltage across the direct current load, the method further comprises:
   increasing a voltage of the direct current load; and
   shutting down the downhole generator if the voltage of the direct current load is greater than the threshold voltage of the direct current load.

9. The method of claim 1, further comprising transmitting a warning signal that the downhole generator is shut down if the first component of the direct current is greater than the first current threshold or if a temperature of the at least one component of the downhole generator is greater than a threshold temperature of the at least one component of the downhole generator.

10. The method of claim 1, further comprising:
    determining a temperature of each component of the at least one component of the downhole generator; and
    shutting down the downhole generator if the temperature of any component of the at least one component of the downhole generator is greater than a threshold temperature of the respective component of the at least one component of the downhole generator.

11. The method of claim 1, further comprising:
    determining, at a time interval after the downhole generator has been shut down, the speed of the alternator; and restarting the downhole generator if the speed of the alternator is less than or equal to the threshold speed.

12. A downhole generator, comprising:
a turbine operable to generate mechanical energy from a fluid flow;
an alternator operable to convert the mechanical energy into an alternating current;
a power converter operable to convert the alternating current to a direct current to supply power to a direct current load; and
a controller operable to:
determine a speed of the alternator;
convert the alternating current into a first component of the direct current and a second component of the direct current; and
activate an overvoltage protection mode if the speed of the alternator is greater than a threshold speed,
wherein when the overvoltage protection mode is activated, the controller is further operable to:
determine a first current threshold based on at least one component of the downhole generator;
determine a temperature at each component of the at least one component of the downhole generator;
shut down the downhole generator if the first component of the direct current is greater than the first current threshold or if the temperature at any component of the at least one component of the downhole generator is greater than a threshold temperature of the respective component of the at least one component of the downhole generator; and
decrease a magnetic flux of the downhole generator if the first component of the direct current is not greater than the first current threshold and if the temperature at each component of the at least one component of the downhole generator is not greater than the threshold temperature of the respective component of the at least one component of the downhole generator.

13. The downhole generator of claim 12, wherein if a voltage of the alternator is not greater than a threshold fraction of a voltage across a direct current load, the controller is further operable to:
increase a first input to a value greater than the first component of a direct current to maintain a voltage across the alternator at a rated value;
calculate a second input based on the first input and the first current threshold; and
provide the first input and the second input to the controller to modify a back electromotive force.

14. The downhole generator of claim 13, wherein if the voltage of the alternator is greater than the threshold fraction of the voltage across a direct current load, the controller is further operable to:
increase the voltage of the direct current load; and
shutdown the downhole generator if the voltage of the direct current load is greater than the threshold voltage of the direct current load.

15. The downhole generator of claim 12, wherein the controller is further operable to transmit a warning signal that the downhole generator is shut down if the first component of the direct current is greater than the first current threshold or if the temperature at any component of the at least one component of the downhole generator is greater than the threshold temperature of the respective component of the at least one component of the downhole generator.

16. A machine-readable medium comprising instructions stored therein, which when executed by one or more processors, cause the one or more processors to perform operations comprising:
determining a speed of an alternator of a downhole generator; and
activating an overvoltage protection mode if the speed of the alternator is greater than a threshold speed,
wherein activating the overvoltage protection mode comprises:
converting an alternating current measured at the alternator into a first component of a direct current and a second component of the direct current;
determining a first current threshold based on at least one component of the downhole generator;
determining a temperature at the at least one component of the downhole generator;
shutting down the downhole generator if the first component of the direct current is greater than the first current threshold or if the temperature at any component of the at least one component of the downhole generator is greater than a threshold temperature of the respective component of the at least one component of the downhole generator; and
decreasing a magnetic flux of the downhole generator if the first component of the direct current is not greater than the first current threshold and if the temperature at each component of the at least one component of the downhole generator is not greater than the threshold temperature of the respective component of the at least one component of the downhole generator.

17. The machine-readable medium of claim 16, wherein the instructions when executed by the one or more processors, cause the one or more processors to perform operations comprising:
increasing a first input to a value greater than the first component of a direct current to maintain a voltage of the alternator at a rated value;
calculating a second input based on the first input and the first current threshold; and
providing the first input and the second input to a controller to modify a back electromotive force.

18. The machine-readable medium of claim 17, wherein the instructions when executed by the one or more processors, cause the one or more processors to perform operations comprising:
determining a temperature at a winding of the alternator;
determining a second current threshold based on the temperature at the winding of the alternator;
determining a power rating of a turbine of the downhole generator;
determining a third current threshold based on the power rating of the turbine; and
setting a value of the first current threshold to equal to a minimum of the second current threshold and the third current threshold.

19. The machine-readable medium of claim 18, wherein the instructions when executed by the one or more processors, cause the one or more processors to perform operations comprising:
determining a temperature at a power convertor component of the downhole generator; and
determining a fourth current threshold at the power convertor based on the temperature at the power convertor component, wherein setting the value of the first current threshold comprises setting the value of the first current threshold to equal to a minimum of the second current threshold, the third current threshold, and the fourth current threshold.

20. The machine-readable medium of claim 19, wherein the instructions when executed by the one or more processors, cause the one or more processors to perform operations comprising:
  determining an interior temperature of the power convertor component of the downhole generator; and
  determining a fifth current threshold at the power convertor based on the interior temperature of the power convertor component,
  wherein setting the value of the first current threshold comprises setting the value of the first current threshold to equal to a minimum of the second current threshold, the third current threshold, the fourth current threshold, and the fifth current threshold.

* * * * *